United States Patent
Heinrichs et al.

(10) Patent No.: US 10,527,701 B2
(45) Date of Patent: Jan. 7, 2020

(54) SYSTEM FOR MAGNETIC SELF TEST

(71) Applicant: Infineon Techologies AG, Neubiberg (DE)

(72) Inventors: Frank Heinrichs, Villach (AT); Dirk Hammerschmidt, Villach (AT)

(73) Assignee: Infineon Technologies AG, Neubiberg (DE)

(*) Notice: Subject to any disclaimer, the term of this patent is extended or adjusted under 35 U.S.C. 154(b) by 437 days.

(21) Appl. No.: 14/512,500

(22) Filed: Oct. 13, 2014

(65) Prior Publication Data

US 2015/0102804 A1  Apr. 16, 2015

(30) Foreign Application Priority Data

Oct. 14, 2013 (CN) .................... 2013 2 0632445 U

(51) Int. Cl.
*G01R 35/00* (2006.01)
*G01R 33/00* (2006.01)

(52) U.S. Cl.
CPC ......... *G01R 35/00* (2013.01); *G01R 33/0017* (2013.01); *G01R 33/0035* (2013.01)

(58) Field of Classification Search
CPC .. G01N 27/9086; G01N 27/74; G01R 35/005; G01V 13/00
USPC ......... 324/202, 74, 130; 73/1.01; 250/252.1; 356/46
See application file for complete search history.

(56) References Cited

U.S. PATENT DOCUMENTS

| 5,894,425 A * | 4/1999 | Saliba | G01R 31/31915 345/169 |
| 8,844,380 B2 * | 9/2014 | Takahashi | G01L 3/104 73/862 |
| 8,875,557 B2 * | 11/2014 | Chian | F23N 5/242 361/247 |
| 2003/0016008 A1 * | 1/2003 | Christensen | G01V 3/104 324/207.26 |
| 2005/0216149 A1 * | 9/2005 | Kato | G01P 21/00 73/1.37 |
| 2010/0057299 A1 * | 3/2010 | Burgdorf | G01D 5/2451 701/42 |
| 2010/0066173 A1 * | 3/2010 | Angquist | H02J 7/025 307/66 |
| 2010/0211347 A1 * | 8/2010 | Friedrich | G01R 33/0023 702/117 |

(Continued)

Primary Examiner — Dominic E Hawkins
(74) Attorney, Agent, or Firm — Eschweiler & Potashnik, LLC

(57) ABSTRACT

The disclosure provides a system for magnetic self test. The system includes an electronic control unit (ECU) including a controller. Only one sensor is electrically coupled to the ECU, wherein the sensor includes a sensing element, a signal conditioning element electrically coupled to the sensing element and the controller, and a wire-on-chip (WOC) device disposed next to the sensing element. The system further includes a WOC stimulus element provided in the ECU or the sensor to drive the WOC to create a WOC magnetic field, wherein the system is configured to compare an expected sensor output signal that is caused by the WOC magnetic field with an actual sensor output signal by the controller or an additional signal assessment element in the sensor to identify whether the sensor is still functioning correctly.

19 Claims, 4 Drawing Sheets

(56) References Cited

U.S. PATENT DOCUMENTS

| | | | |
|---|---|---|---|
| 2011/0012431 A1* | 1/2011 | Karalis | B60L 11/182 307/104 |
| 2012/0153936 A1* | 6/2012 | Romani | G01R 33/0035 324/202 |
| 2013/0211646 A1* | 8/2013 | Yamamura | G05D 1/0225 701/22 |
| 2014/0266181 A1* | 9/2014 | Milano | G01R 31/2884 324/251 |
| 2014/0347340 A1* | 11/2014 | Tse | G09G 5/18 345/212 |

* cited by examiner

SYSTEM FOR MAGNETIC SELF TEST

CROSS REFERENCE TO RELATED APPLICATION

This application claims priority to Chinese Patent Application serial number 201320632445.2 filed on Oct. 14, 2013 and is hereby incorporated in its entirety.

FIELD

This disclosure relates to a system, in particular, to a system for magnetic self test.

BACKGROUND

Magnetic sensors are used in safety relevant applications, e.g. power steering. To achieve state-of-the art safety standards as described e.g. in ISO26262 automotive safety integrity levels are defined on the system level. The implementation of the required safety concept is broken down from the system and results in the implementation of safety mechanisms on the component level. The application consists of one or more magnetic sensors and an electronic control unit (ECU) that reads the output(s) from the sensor(s).

Today, the standard solution to achieve the required safety integrity level is to use redundancy, that is to place multiple (e.g. two) sensors in the application. A failure of one sensor can be detected in the ECU by a deviation of the output signals between the two sensors. The disadvantages are:
  added (doubled) cost due to additional sensor;
  In case of sensor failure, the system can not decide which sensor is failing and which is still in spec. This means that the system can not maintain normal operation. In case a system shut down is not a safe state, this may lead to the need for even more redundancy (e.g. three sensors) or other additional measures to identify the correct sensor output.

SUMMARY

The present disclosure provides means to verify if the sensor is still functioning correctly. This is done by implementing a so-called "wire-on-chip" (WOC) device on the sensor chip, means to generate a current flow through the WOC, and means to compare the actual sensor output to the expected sensor output that is caused by the WOC magnetic field.

According to an aspect of the disclosure, a system for magnetic self test, comprises an electronic control unit (ECU) including a controller, wherein only one sensor is electrically coupled to the ECU. The sensor comprises a sensing element, a signal conditioning element electrically coupled to the sensing element and the controller, and a wire-on-chip (WOC) device disposed next to the sensing element. The system further comprises a WOC stimulus element provided in the ECU or the sensor to drive the WOC to create a WOC magnetic field, wherein the system is configured to compare an expected sensor output signal that is caused by the WOC magnetic field with an actual sensor output signal by the controller or an additional signal assessment element in the sensor to identify whether the sensor is still functioning correctly.

In one embodiment the WOC stimulus element is provided in the ECU and receives the command signal from the controller to drive the WOC.

In one embodiment the WOC stimulus element is provided in the sensor and receives the command signal from the controller to drive the WOC.

In one embodiment the sensor further comprises an integrated energy storage device, the energy storage device is powered by an external supply and electrically coupled to the WOC stimulus element provided in the sensor to avoid high current consumption peaks of the sensor during the magnetic self test.

In one embodiment the energy storage device is one or more capacitors in series or parallel connection.

In one embodiment the sensor further comprises an integrated capacitor parallel connected with the WOC, wherein the inductor of the WOC and the integrated capacitor form a resonant circuit that is excited by an internal driver device, the input of which is connected to the WOC stimulus element.

In one embodiment the internal driver device is an amplifier.

In one embodiment the WOC stimulus element and the controller are configured to not be synchronized in real time with a synchronization signal sent from the WOC stimulus element to the controller being not needed.

In one embodiment the WOC stimulus element is configured to send a synchronization signal to the controller so as to achieve real-time synchronization between the WOC stimulus element and the controller.

In one embodiment the WOC stimulus element is configured to send a synchronization signal to the additional signal assessment element rather than the controller so as to achieve real-time synchronization between the WOC stimulus element and the additional signal assessment element.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the utility model may be practiced. It is to be understood that other embodiments may be utilized and structural or logical changes may be made without departing from the scope of the present disclosure. The following detailed description, therefore, is not to be taken in a limiting sense, and the scope of the present utility model is defined by the appended claims.

It is to be understood that the features of the various example embodiments described herein may be combined with each other, unless specifically noted otherwise.

As employed in this specification, the terms "coupled" and/or "electrically coupled" are not meant to mean that the elements must be directly coupled together; intervening elements may be provided between the "coupled" or "electrically coupled" elements.

The utility model solves the above-mentioned problem by offering means to verify if the sensor is still functioning correctly. This is done by implementing a so-called "wire-on-chip" (WOC) device on the sensor chip, means to generate a current flow through the WOC, and means to compare the actual sensor output to the expected sensor output that is caused by the WOC magnetic field.

Wire-on-chip Implementation Examples

The "wire-on-chip" (WOC) device, which may be used for the case of vertical Hall-Plates, lateral Hall-Plates, and xMR, is disposed on the sensor chip next to the sensor element and creates a magnetic field of known value when a known current is applied, as illustrated in FIGS. 1-4.

Electric Stimulus of the WOC

The disclosure includes four different variations how to activate the WOC.

First Embodiment

Figure 1:
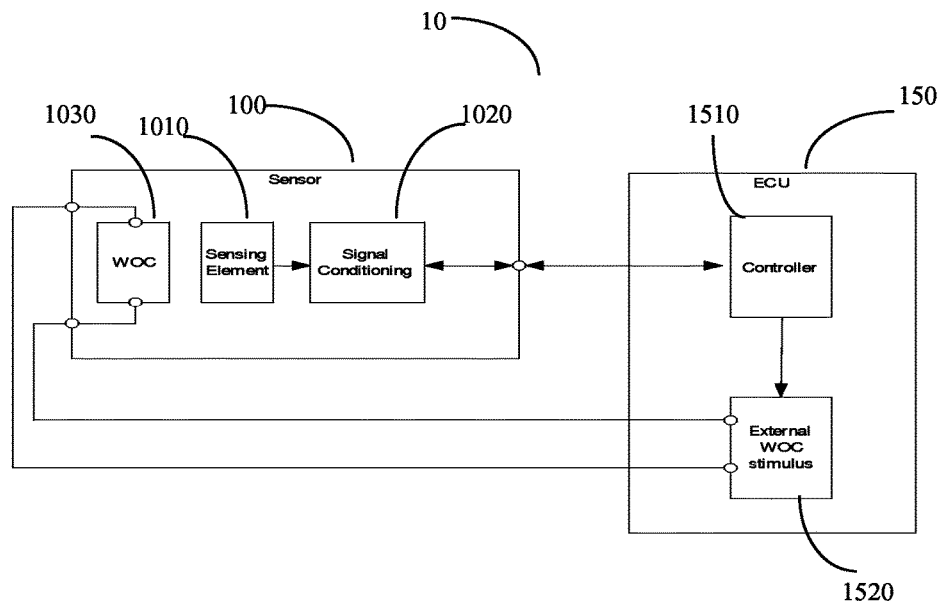
FIG. 1 illustrates an embodiment of Electric stimulus of the WOC, wherein external connections (pins) are provided so the customer can connect an external signal source.

As illustrated in FIG. 1, the system 10 comprises one sensor 100 e.g. magnetic sensor, and an electronic control unit (ECU) 150 that reads the output(s) from the sensor. The sensor comprise a sensing element 1010, a signal conditioning element 1020 electrically coupled to the sensing element 1010 and a WOC device 1030 disposed next to the sensing element 1010. The ECU 150 comprises a controller 1510 electrically coupled to the sensor 100. The controller triggers a known current pattern in the WOC and verifies if the expected output signal is received from the sensor.

An external WOC stimulus element 1520 is comprised in the ECU 150 to provide an external activation to the WOC.

Second Embodiment

Figure 2:
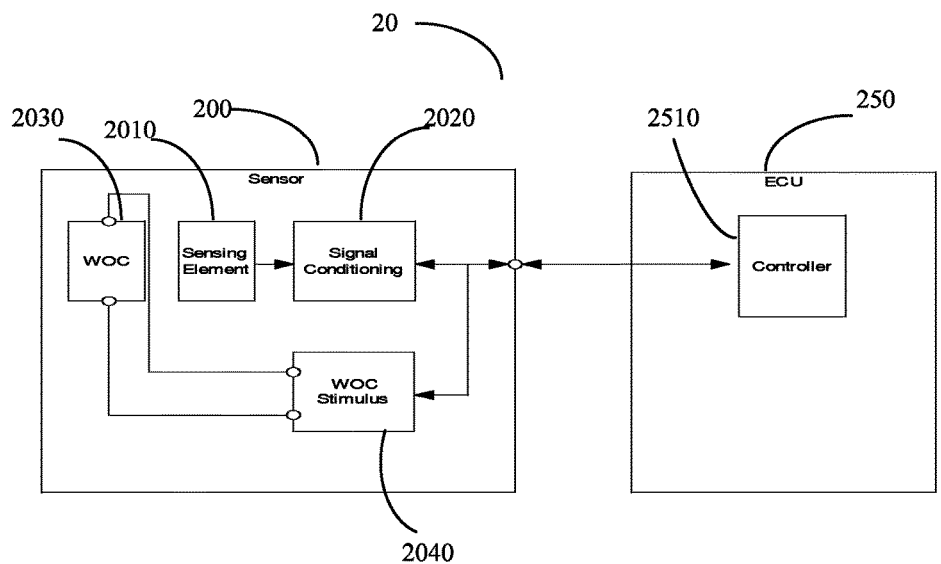
FIG. 2 illustrates an embodiment of Electric stimulus of the WOC, wherein a signal generation block in the sensor and means to trigger the signal by the ECU are provided. For instance the ECU sends a defined command to the sensor, this triggers a defined current (DC or AC or pulse of defined length or defined sequence of pulses) to be sent through the WOC.

As illustrated in FIG. 2, the system 20 comprises one sensor 200 e.g. magnetic sensor, and an electronic control unit (ECU) 250 that reads the output(s) from the sensor. The sensor comprise a sensing element 2010, a signal conditioning element 2020 electrically coupled to the sensing element 2010 and a WOC device 2030 disposed next to the sensing element 2010. The ECU 250 comprises a controller 2510 electrically coupled to the sensor 200. The controller triggers a known current pattern in the WOC and verifies if the expected output signal is received from the sensor.

An internal WOC stimulus element 2040 is comprised in the sensor 200 to provide an internal activation to the WOC. For instance the ECU sends a defined command to the sensor, this triggers a defined current (DC or AC or pulse of defined length or defined sequence of pulses) to be sent through the WOC.

This embodiment has the challenge that high currents need to be driven through the WOC in order to achieve high enough magnetic field values. The following two embodiments are ideas how to overcome this issue.

Third embodiment

Figure 3:
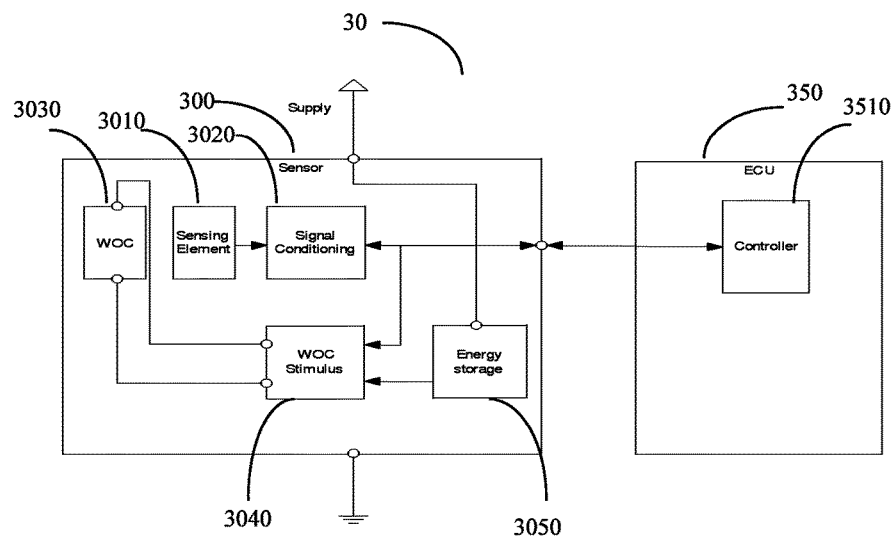
FIG. 3 illustrates an embodiment of Electric stimulus of the WOC, which is similar to FIG. 2, but using a integrated energy storage device, e.g. integrated capacitor, to avoid high current consumption peaks of the sensor during the magnetic self test.

As illustrated in FIG. 3, the third embodiment is similar to the second embodiment, that is to say, the system 30 comprises one sensor 300 e.g. magnetic sensor, and an electronic control unit (ECU) 350 that reads the output(s) from the sensor. The sensor comprise a sensing element 3010, a signal conditioning element 3020 electrically coupled to the sensing element 3010 and a WOC device 3030 disposed next to the sensing element 3010. The ECU 350 comprises a controller 3510 electrically coupled to the sensor 300. The controller triggers a known current pattern in the WOC and verifies if the expected output signal is received from the sensor.

An internal WOC stimulus element 3040 is comprised in the sensor 300 to provide an internal activation to the WOC. For instance the ECU sends a defined command to the sensor, this triggers a defined current (DC or AC or pulse of defined length or defined sequence of pulses) to be sent through the WOC.

The difference between the third embodiment and the second embodiment is that an integrated energy storage device 3050, e.g. one or more integrated capacitors, in series or parallel with each other, are composed in the sensor to avoid high current consumption peaks of the sensor during the magnetic self test. The energy storage device 3050 is powered by a supply and electrically coupled to the WOC stimulus element 3040.

Fourth embodiment

Figure 4:
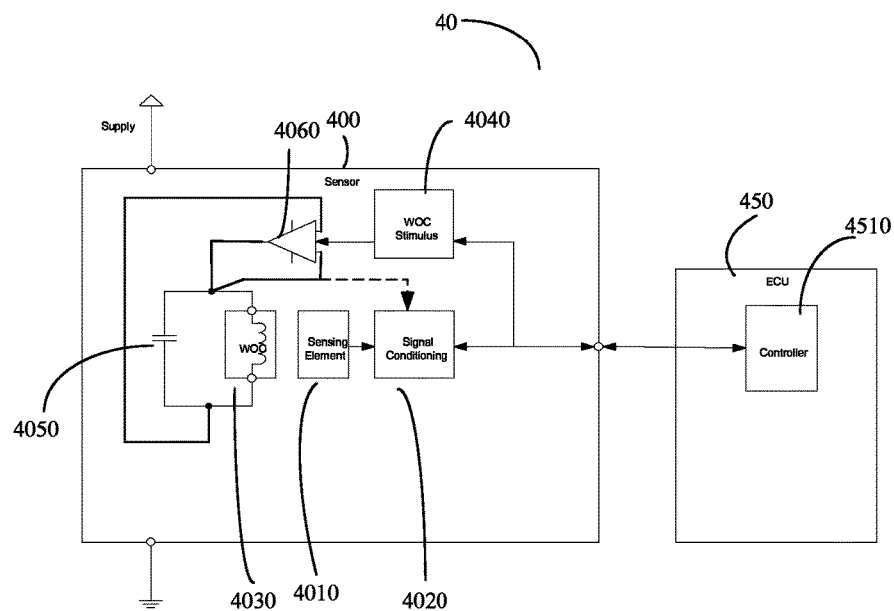
FIG. 4 illustrates an embodiment of Electric stimulus of the WOC, where the inductor of the WOC and the integrated capacitor form a resonant circuit that is excited by an internal driver device. This allows to create high DC currents of defined frequency in the WOC with very low DC current consumption from the supply.

As illustrated in FIG. 4, the fourth embodiment is similar to the second embodiment, that is to say, the system 40 comprises one sensor 400 e.g. magnetic sensor, and an electronic control unit (ECU) 450 that reads the output(s) from the sensor. The sensor comprise a sensing element 4010, a signal conditioning element 4020 electrically coupled to the sensing element 4010 and a WOC device 4030 disposed next to the sensing element 4010. The ECU 450 comprises a controller 4510 electrically coupled to the sensor 400. The controller triggers a known test pattern in the WOC by enabling or disabling a feed forward coupling via the driver 4060. The enabling of the feed forward loop sets the WOC resonator into a self resonant oscillation which reaches an amplitude that depends on the Q-factor of the resonator. The WOC stimulus in this case is an oscillation modulated by the stimulus pattern. The controller monitors the output signals of the magnetic field sensor and detect if an effect caused by the oscillation appears and disappears according to the known test pattern.

An internal WOC oscillation control element 4040 is comprised in the sensor 400 to provide an internal activation to the WOC by activating or deactivating the oscillation that is generated by the loop that is formed by the WOC 4030, the capacitor 4050 and the driving amplifier 4060. For instance the ECU sends a defined command to the sensor, this triggers an activation and a resulting AC current flowing between the resonator elements WOC 4030 and capacitor 4050.

The difference between the fourth embodiment and the second embodiment is that one or more integrated capacitor 4050 (although only one are shown in the Figure) are parallel connected with the WOC, the inductor of the WOC and the integrated capacitor form a resonant circuit that is excited by an internal driver device 4060, the enable input of which is connected to the WOC stimulus element 4040. This allows creation of high AC currents of defined frequency in the WOC with very low DC current consumption from the supply.

Means to Perform the Assessment of the Sensor Output

To enable effective assessment of the output signal (i.e. output signal matches expected signal->sensor functional vs. output signal does not match expected signal->sensor failure) means to synchronize the signal generation block with the signal assessment block needs to be provided (except for the above first embodiment where both is done within the ECU). This disclosure includes three different embodiments:

No Real-time Synchronization

In this method embodiment, the ECU only triggers the start of the WOC stimulus. The specification of the chip-internal stimulus is used to define limits for the ECU comparison. This method can be used in the above second embodiment-fourth embodiment. For example for the fourth embodiment corresponding to FIG. 4, the min and max frequency and amplitude of the expected output signal are known and used as acceptance limits in the uC SW (microcontroller switch). This very simple method however limits the sensitivity of the failure detection and the ability to filter out the test-signal from the actual application signal.

b) real-time synchronization to ECU.

Figure 5:
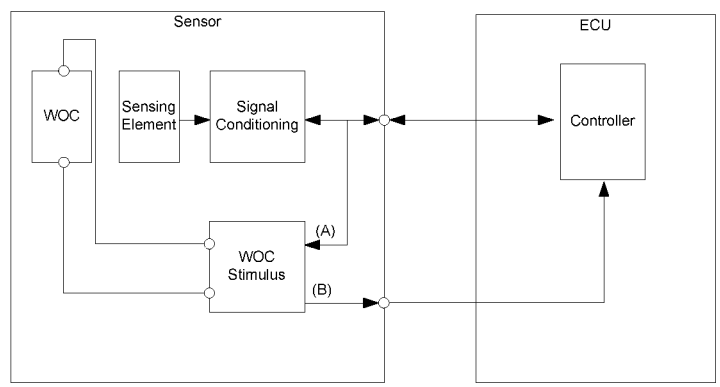
FIG. 5 illustrates an embodiment of performing the assessment of the sensor output, wherein in FIG. 5, line (A) represents the signal from the ECU to the sensor that triggers the start of the magnetic self test, line (B) represents a synchronization signal provided from the sensor to the ECU.
Figure 6:
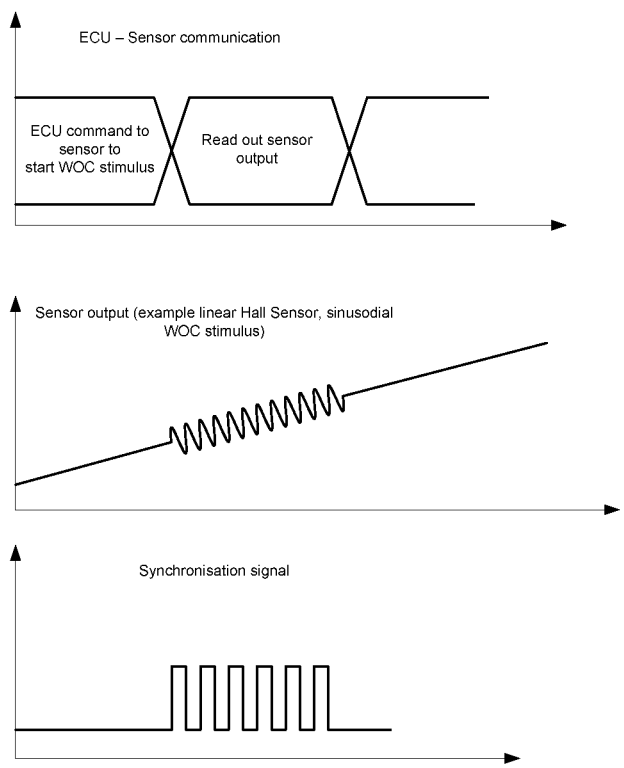
FIG. 6 shows synchronization signal.

This solution employs an additional signal from the sensor to the ECU that supplies real-time information to the ECU. This information is used to synchronize the signal assessment to the WOC stimulus. This is shown schematically in the FIGS. 5-6. This method can be used in the above second embodiment-fourth embodiment.

c) real-time synchronization with on-chip assessment

Figure 7:
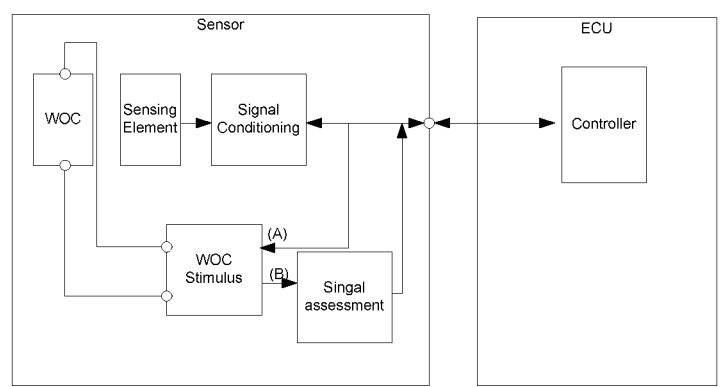
FIG. 7 illustrates an embodiment of real-time synchronization with on-chip assessment.

This method is similar to (b), only that the comparison between the actual and the expected signal is done within the sensor IC, not on the ECU. This means that the synchronization signal is not needed to be supplied to the ECU but is only used as a sensor internal signal. This is shown schematically in the FIG. 7. This method can be used in the above second embodiment-fourth embodiment. The embodiment of FIG. 4 may for example be implemented in a way that uses the real-time synchronized assessment of the test signals by feeding back the oscillation frequency of the WOC LC oscillator into the evaluation block in order to allow a synchronous demodulation of the AC component in the sensor signal. This relaxes the effort for the detection of the oscillation on the side of the controller by relaxing the requirement for a high sampling frequency of the controllers ADC.

Although specific embodiments have been illustrated and described herein, it will be appreciated by those of ordinary skill in the art that a variety of alternate and/or equivalent implementations may be substituted for the specific embodiments shown and described without departing from the scope of the present utility model. For example, the feature(s) in one embodiment can be used in another embodiment unless illogically. This application is intended to cover any adaptations or variations of the specific embodiments discussed herein. Therefore, it is intended that this utility model be limited only by the claims and the equivalents thereof.

What is claimed is:

1. A system for magnetic self test, comprising:
   an electronic control unit (ECU) including a controller;
   only one sensor electrically coupled to the ECU, wherein the sensor comprises a sensing element, a signal conditioning element electrically coupled to the sensing element and the controller, and a wire-on-chip (WOC) device disposed next to the sensing element;
   a WOC stimulus element provided in the ECU or the sensor to drive the WOC device based at least in part on a test pattern to create a WOC magnetic field,
   wherein the system is configured to compare an expected sensor output signal that is caused by the WOC magnetic field with an actual sensor output signal by the controller or an additional signal assessment element in the sensor to identify whether the sensor is still functioning correctly,
   wherein the sensor further comprises one or more integrated capacitors parallel connected with the WOC device, wherein the inductor of the WOC device and the integrated capacitor form a resonant circuit that is excited by an internal driver device, the enabling input of which is connected to the WOC stimulus element, and
   wherein the controller is configured to trigger the test pattern based on one of enabling or disabling a feed forward loop.

2. The system of claim 1, wherein the WOC stimulus element is provided in the ECU and receives the command signal from the controller to drive the WOC device.

3. The system of claim 1, wherein the WOC stimulus element is provided in the sensor and receives the command signal from the controller to drive the WOC device.

4. The system of claim 1, wherein the sensor further comprises an integrated energy storage device, wherein the energy storage device is powered by an external supply and electrically coupled to the WOC stimulus element provided in the sensor to avoid high current consumption peaks of the sensor during the magnetic self test.

5. The system of claim 4, wherein the energy storage device is one or more capacitors in series or parallel connection.

6. The system of claim 1, wherein the internal driver device is an amplifier.

7. The system of claim 1, wherein the WOC stimulus element and the controller are configured to not be synchronized in real-time with a synchronization signal sent from the WOC stimulus element to the controller being not needed.

8. The system of claim 1, wherein the WOC stimulus element is configured to send a synchronization signal to the controller so as to achieve real-time synchronization between the WOC stimulus element and the controller.

9. The system of claim 1, wherein the WOC stimulus element is configured to send a synchronization signal to the additional signal assessment element rather than the controller so as to achieve real-time synchronization between the WOC stimulus element and the additional signal assessment element.

10. The system of claim 7, wherein the synchronization signal is derived from the resonant circuit or the internal driver device and the additional signal assessment element contains a synchronous demodulation of the sensor output signal.

11. The system of claim 1, wherein the WOC stimulus element drives the WOC via an oscillation of the resonant circuit modulated by the test pattern.

12. A system for magnetic self test, comprising:
an electronic control unit (ECU) including a controller;
only one sensor electrically coupled to the ECU, wherein the sensor comprises a sensing element, a signal conditioning element electrically coupled to the sensing element and the controller, and a wire-on-chip (WOC) device disposed next to the sensing element;
a WOC stimulus element provided in the ECU or the sensor to drive the WOC device to create a WOC magnetic field,
wherein the system is configured to compare an expected sensor output signal that is caused by the WOC magnetic field with an actual sensor output signal by the controller or an additional signal assessment element in the sensor to identify whether the sensor is still functioning correctly,
wherein the sensor further comprises an integrated energy storage device, wherein the energy storage device is powered by an external supply and electrically coupled to the WOC stimulus element provided in the sensor to avoid high current consumption peaks of the sensor during the magnetic self test.

13. The system of claim 12, wherein the sensor further comprises one or more integrated capacitors parallel connected with the WOC device, wherein the inductor of the WOC device and the integrated capacitor form a resonant circuit that is excited by an internal driver device, the enabling input of which is connected to the WOC stimulus element, and wherein the controller is configured to trigger the test pattern based on one of enabling or disabling a feed forward loop.

14. The system of claim 13, wherein the internal driver device is an amplifier.

15. The system of claim 13, wherein the WOC stimulus element and the controller are configured to not be synchronized in real-time with a synchronization signal sent from the WOC stimulus element to the controller being not needed.

16. The system of claim 15, wherein the synchronization signal is derived from the resonant circuit or the internal driver device and the additional signal assessment element contains a synchronous demodulation of the sensor output signal.

17. The system of claim 13, wherein the WOC stimulus element is configured to send a synchronization signal to the controller so as to achieve real-time synchronization between the WOC stimulus element and the controller.

18. The system of claim 13, wherein the WOC stimulus element is configured to send a synchronization signal to the additional signal assessment element rather than the controller so as to achieve real-time synchronization between the WOC stimulus element and the additional signal assessment element.

19. The system of claim 12, wherein the energy storage device is one or more capacitors in series or parallel connection.

* * * * *